US006660606B2

(12) United States Patent
Miyabayashi et al.

(10) Patent No.: US 6,660,606 B2
(45) Date of Patent: Dec. 9, 2003

(54) SEMICONDUCTOR-ON-INSULATOR ANNEALING METHOD

(75) Inventors: Hiroshi Miyabayashi, Kanagawa (JP); Nobuhiko Sato, Kanagawa (JP); Masataka Ito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 163 days.

(21) Appl. No.: 09/963,449

(22) Filed: Sep. 27, 2001

(65) Prior Publication Data

US 2002/0061631 A1 May 23, 2002

(30) Foreign Application Priority Data

Sep. 29, 2000 (JP) ........................................ 2000-299616

(51) Int. Cl.$^7$ ............................................. H01L 21/336
(52) U.S. Cl. ........................ 438/308; 438/509; 438/143; 438/151; 438/406
(58) Field of Search ................................ 438/308, 406, 438/408, 409, 455–458, 479, 753

(56) References Cited

U.S. PATENT DOCUMENTS

| 5,371,037 A | 12/1994 | Yonehara |
| 5,374,564 A | 12/1994 | Bruel |
| 5,773,355 A | 6/1998 | Inoue et al. ................. 438/459 |
| 5,863,830 A | 1/1999 | Bruel et al. ................. 438/478 |
| 5,869,387 A | 2/1999 | Sato et al. .................. 438/459 |
| 6,140,210 A | 10/2000 | Aga et al. ................... 438/458 |
| 6,171,982 B1 | 1/2001 | Sato ........................... 438/795 |
| 6,238,990 B1 * | 5/2001 | Aga et al. ................... 438/308 |
| 6,335,269 B1 * | 1/2002 | Sato ........................... 438/509 |
| 6,362,076 B1 | 3/2002 | Inazuki et al. .............. 438/458 |
| 6,372,609 B1 | 4/2002 | Aga et al. ................... 438/459 |
| 6,413,874 B1 * | 7/2002 | Sato ........................... 438/714 |

FOREIGN PATENT DOCUMENTS

| EP | 0 926 707 | 6/1999 |
| EP | 0 926 713 | 6/1999 |
| EP | 0 954 014 A1 | 11/1999 |
| JP | 5-21338 | 1/1993 |
| JP | 5-217821 | 8/1993 |
| JP | 2608351 | 5/1997 |
| JP | 11-102848 | 4/1999 |
| JP | 11-145020 | 5/1999 |
| JP | 11-307472 | 11/1999 |
| JP | 11-340444 | 12/1999 |
| JP | 2000-124092 | 4/2000 |
| WO | WO 00/24059 | 4/2000 |

OTHER PUBLICATIONS

D.K. Sadana et al., "Nano–Defects in Commercial Bonded SOI and SIMOX," *Proceedings 1994 IEEE International SOI Conference*, pp. 111–112 (1994).
Hiroji Aga et al., "Study of HF Defects in Thin, Bonded Silicon–on–Insulator Dependent on Original Wafers," 38(1, 5A) *Jpn. J. Appl. Phys.* 2694–2698 (1999).

* cited by examiner

Primary Examiner—Dung A Le
(74) Attorney, Agent, or Firm—Fitzpatrick, Cella, Harper & Scinto

(57) ABSTRACT

The number of defects (HF defects) in the SOI layer of an SOI substrate is reduced. In an annealing method of annealing an SOI substrate in a reducing atmosphere at a temperature equal to or less than the melting point of a semiconductor, annealing is executed in a state wherein a flow of a reducing atmospheric gas parallel to the surface of the SOI substrate is generated near this surface.

12 Claims, 10 Drawing Sheets

150nm

SEMICONDUCTOR-ON-INSULATOR ANNEALING METHOD

FIELD OF THE INVENTION

The present invention relates to an annealing method for an SOI substrate having a semiconductor layer such as a silicon layer formed on an insulator, in which the number of defects (HF defects) in an SOI layer (the semiconductor layer on the insulator) and, more specifically, the number of HF defects which increase as an SOI layer becomes thin is reduced by annealing the SOI substrate in a reducing gas atmosphere, and an SOI substrate using the annealing method.

BACKGROUND OF THE INVENTION

Sato et al. has reported a technique of annealing an SOI (Semiconductor On Insulator) wafer in a reducing atmosphere, in which, e.g., annealing in hydrogen gas at 1,000° C. yields so high planarity that the roughness on an SOI layer surface is 2 nm or less (Japanese Patent Laid-Open No. 05-217821 and U.S. Pat. No. 5,371,037).

This technique will be described with reference to FIGS. 6 and 7. An example using a vertical annealing furnace is shown in FIG. 6.

Referring to FIG. 6, reference numeral 101 denotes a furnace tube serving as a reactor. An atmospheric gas is supplied from a supply pipe 102 arranged at the upper portion and exhausted from an exhaust pipe 103 at the lower portion. Reference numeral 104 denotes a heater; and 105, a boat which is made of silicon carbide set on a heat barrier 107 arranged on a furnace lid 106 and holds a plurality of SOI substrates 108. The boat 105 is formed from silicon carbide manufactured by sintering. The boat 105 may have a coating of chemically synthesized silicon carbide that is synthesized by chemical vapor phase deposition on a surface of silicon carbide manufactured by sintering.

Annealing is performed in accordance with the following procedure. The furnace lid 106 is moved downward in advance. In this state, the SOI wafers 108 are set in the boat 105. The furnace lid 106 is moved to the position shown in FIG. 6 to place the SOI wafers 108 in the process chamber and close the opening portion of the furnace tube 101. The furnace lid 106 is operated by an elevating mechanism (not shown). The interior of the process chamber is replaced with a hydrogen gas atmosphere by supplying hydrogen gas from the supply pipe 102 into the furnace tube 101.

The flow of the atmospheric gas in the annealing furnace will be described with reference to FIG. 7. Referring to FIG. 7, reference numeral 101 denotes a furnace tube; 105, a boat made of silicon carbide; and 108, SOI substrates, as in FIG. 6. Reference numerals 114 and 115 denote atmospheric gas flows.

The speed of the atmospheric gas flow 115 near an SOI substrate surface during annealing can be substantially set to zero, i.e., the flow can be eliminated by equalizing intervals 116 and 117 between the boat 105 and the furnace tube 101.

The speed of the atmospheric gas flow 114 means the speed of a gas that passes through a region excluding the sectional area of the SOI substrate 108 from the sectional area of the furnace tube 101.

Next, the interior of the process chamber is heated to a predetermined processing temperature by the heater 104, and annealing is performed. After the elapse of a predetermined time, the temperature of the heater 104 is reduced, and then, nitrogen gas is supplied into the process chamber to replace the atmosphere. The furnace lid 106 is moved downward, and the SOI substrates 108 are unloaded. The processing temperature and time are determined in accordance with a desired annealing effect.

Another technique has been proposed in which an SOI substrate formed by bonding wafers manufactured by the CZ method (Czochralski method) is annealed in a reducing atmosphere using a rapid heating/cooling apparatus (rapid thermal annealer; to be referred to as an RTA apparatus hereinafter), thereby reducing COPs (crystal originated particles; defects observed in a silicon wafer formed by the CZ method) on an SOI layer surface (Japanese Patent Laid-Open No. 11-145020).

In addition, a technique has been proposed in which an SOI substrate formed by a method called a hydrogen ion implantation peeling method, in which a wafer with hydrogen ions implanted is bonded to another silicon wafer and then peeled to form an SOI substrate, and is annealed in a reducing atmosphere using an RTA apparatus, thereby removing the damaged layer or surface roughness of an SOI layer while maintaining the film thickness uniformity of the SOI layer (Japanese Patent Laid-Open Nos. 11-307472 and 12-124092).

One of the factors that decrease the yield of devices manufactured using SOI wafers is defects in a single-crystal Si layer (SOI layer).

Defects in an SOI layer include HF defects that are detected by dipping an SOI wafer in a concentrated HF solution (49%) at room temperature. HF defects considerably affect the electrical characteristic of a device.

HF defects are caused by various factors. Sanada et al. checked causes for HF defects in SOI wafers manufactured by a method called SIMOX (Separation by Implanted Oxygen) in which an SOI wafer is formed by implanting oxygen ions, and reported that a metal silicide forms on an SOI layer by metal contamination at the time of ion implantation or annealing and molten in HF dipping to cause HF defects (D. K. Sanada, J. Lasky, H. J. Hovel, K. Petrillo, and P. Roitian, Proc. of IEEE SOI Conf., (1994) p. 111.

Aga et al. reported that HF defects in an SOI substrate manufactured by bonding CZ wafers are caused by COPs (H. Aga, M. Nakano, K. Mitani, Jpn. J. Appl. Phys., (1999) p. 2694).

Aga et al. also described in this report that the density of these HF defects abruptly rises when the SOI layer thickness becomes 200 nm or less because small COPs at the SOI/BOX interface also cause HF defects as the SOI layer becomes thinner.

A manufacturing method (epitaxial layer transfer method) called ELTRAN (registered trademark) has been proposed in which a single-crystal layer is formed on a porous layer formed on a silicon substrate surface, and the single-crystal layer is transferred to another substrate (Japanese Patent No. 2608351).

In the SOI substrate manufactured by the above method, no COPs are formed on the SOI layer because the single-crystal silicon layer is formed by epitaxial growth by CVD (Chemical Vapor Deposition).

However, HF defects are sometimes observed even in an SOI wafer manufactured by the above method, as shown in FIG. 9.

Thinning an SOI layer is an important technical challenge in promoting the advantages of an SOI wafer, i.e., high-speed operation and low power consumption of a device.

For example, the ITRS (SIA, The International Technology Roadmap for Semiconductors (1999) p. 110) requires to reduce the thickness of an SOI layer to 30 to 200 nm until 2003 and further to 20 to 100 nm from 2004.

From this viewpoint, reducing the number of HF defects is a very important challenge not only in improving the yield of devices but also in promoting thinning an SOI layer.

SUMMARY OF THE INVENTION

Details of how the present inventors have reached the present invention will be described below.

The present inventors extensively studied HF defects in an SOI substrate having a silicon layer formed by epitaxial growth and found that the number of HF defects tends to abruptly increase when the thickness of an SOI layer becomes less than 100 nm and also that the HF defects become conspicuous when the SOI layer thickness becomes 70 nm or less as shown in FIG. 9. This tendency that the HF defect density abruptly rises as an SOI layer becomes thinner is consistent with the above-described report by Aga et al.

First, an SOI substrate manufacturing method using the epitaxial layer transfer method will be described below in detail with reference to FIG. 8.

As shown in FIG. 8, in step S31, a single-crystal silicon substrate 131 is prepared as the first substrate, and a porous layer 133 is formed at least on its major surface side. Porous silicon can be formed by anodizing the silicon substrate in an HF solution. The porous layer has a sponge structure in which pores with a diameter of $10^{-1}$ to 10 nm are arranged at an interval of $10^{-1}$ to 10 nm. Although the density of single-crystal silicon is 2.33 g/cm$^{-3}$, the density of pores can be changed within the range of 2.1 to 0.6 g/cm$^{-3}$ by changing the HF solution concentration between 20% to 50%, changing the alcohol adding ratio, or changing the current density. When the resistivity and electrical conductivity type of a portion as a prospective porous layer are modulated in advance, the porosity can be adjusted on the basis of the resistivity and electrical conductivity type. Under the same anodization conditions for p-type, the pore diameter in a P$^-$ silicon substrate becomes smaller than that in a P$^+$ silicon substrate, though the pore density increases by one order of magnitude, i.e., the porosity is high. That is, the porosity can be controlled by changing the conditions, and the method is not limited. The porous layer 133 can have either a single-layer structure or a multi-layered structure in which a plurality of layers with different porosities are stacked. When ions are implanted such that the projection range is included in the porous layer formed by anodization, cavities are formed in pore walls in the porous layer near the projection range, so the porosity can be increased. Ion implantation can be executed either before or after porous layer formation by anodization. Ion implantation may be executed after a single-crystal semiconductor layer structure is formed on the porous layer 133.

In step S32, at least one non-porous single-crystal semiconductor layer 123 such as a single-crystal silicon layer is formed on the porous layer 133. The non-porous single-crystal semiconductor layer 123 is arbitrarily selected from a single-crystal silicon layer formed by epitaxial growth, a non-porous layer formed from the surface layer of the porous layer 133, and the like. When a silicon oxide layer 122 is formed on the non-porous single-crystal semiconductor layer 123 by thermal oxidation, an interface with a low interface level can be formed by the thermal oxidation between the buried oxide film and the non-porous single-crystal semiconductor layer such as a single-crystal silicon layer. In step S33, the major surface (bonding surface) of the semiconductor substrate on which the non-porous single-crystal silicon layer 123 is formed is brought into tight contact with the surface (bonding surface) of a second substrate 121 at room temperature. Before the substrates are brought into tight contact, they are preferably cleaned to remove deposits and foreign substances on the surface. The second substrate can be selected from a silicon substrate, a silicon substrate with a silicon oxide film formed thereon, a transparent substrate formed from silica or the like, and a sapphire substrate. However, any other substrate can be used as long as the surface to be bonded is sufficiently flat and smooth. FIG. 8 shows a state wherein the second substrate 121 and first substrate are bonded via the insulating layer 122. The silicon oxide layer 122 may be omitted.

In bonding, an insulating thin plate may be inserted between the first and second substrates to form a three-layered bonded structure.

Subsequently, an unnecessary portion on the lower surface side of the substrate 131 and the porous layer 133 are removed to expose the non-porous single-crystal silicon layer 123. To do this, the following two methods can be used, though any other method may be used.

As the first method, the first substrate 131 is removed from the lower surface side to expose the porous layer 133 (step S34).

Subsequently, the porous layer 133 is removed to expose the non-porous single-crystal silicon layer 123 (step S35).

The porous layer is preferably removed by selective etching. When a solution mixture containing at least hydrofluoric acid and hydrogen peroxide is used, porous silicon can be selectively etched with a selectivity ratio of $10^5$ times with respect to non-porous single-crystal silicon. The etchant may contain a surfactant for preventing formation of bubbles on the structure surface. Especially, an alcohol such as ethyl alcohol is preferably used. If the porous layer is thin, the selective etching may be omitted.

As the second method, the substrates are separated in the porous layer 133 as a separation layer to obtain the state in step S34 shown in FIG. 8. To separate the substrates, a method of applying an external force such as a pressure, tensile force, shearing force, or a force of a wedge; a method of applying an ultrasonic wave; a method of heating the porous layer; a method of applying an internal pressure to the porous silicon by expanding the porous silicon from the periphery by oxidation; a method of applying thermal stress or softening the porous layer by heating the porous layer while pulse-controlling the temperature; or a method of injecting a fluid such as a water jet or gas jet can be used. However, any other method may be used.

In step S35, the porous layer 133 remaining on the upper surface side of the second substrate 121 is removed by etching. The porous etching method is the same as the method of exposing the porous layer 133 by etching. If the porous silicon layer 133 remaining on the second substrate 121 side has a very small and uniform thickness, wet etching of the porous layer using hydrofluoric acid and hydrogen peroxide need not be executed.

In step S36, the second substrate 121 is annealed in a reducing atmosphere containing hydrogen to remove an upper layer portion 125 having a three-dimensional pattern on the single-crystal silicon layer 123 by etching. At this time, reduction of boron concentration in the single-crystal silicon layer and surface planarization can also simultaneously be achieved.

In the semiconductor substrate obtained by the epitaxial layer transfer method, the single-crystal silicon layer 123 is formed on the entire region of the second substrate 121 as a flat and uniform thin layer having a large area. The thus obtained semiconductor substrate can be adequately used from the viewpoint of manufacturing an insulated electronic device.

If the surface roughness of the separated first single-crystal silicon substrate 131 still falls outside the allowable range even after the porous layer remaining on the separation surface is removed, surface planarization is executed. With this processing, the substrate can be used again as the first single-crystal silicon substrate 131 or the next second substrate 121.

The present inventors observed with a scanning electronic microscope HF defects in an SOI substrate after step S35 in FIG. 8, which is manufactured by the above method. FIG. 10 shows the scanning-electronic-microscopic image of an HF defect. The HF defect (marked by a circle in FIG. 10) has a small pinhole shape with a diameter of 60 nm or less. Since the shape is not tetrahedral but circular, it is not a COP. When the thickness of an SOI layer is less than 100 nm, the number of HF defects tends to abruptly increase, as shown in FIG. 9.

For an SOI substrate having a silicon layer formed by epitaxial growth, the present inventors also extensively studied HF defects which abruptly increase in number in an SOI substrate whose SOI layer (semiconductor layer on an insulator) has a thickness less then 100 nm or equal to or less than 70 nm.

Consequently, it was confirmed that the number of HF defects can be reduced by executing annealing described in Japanese Patent Laid-Open No. 05-217821.

This is probably because that in annealing in a hydrogen atmosphere, silicon atoms that are excited on the surface by the thermal energy move to reduce the surface energy, thereby filling the defects.

However, if the HF defects are so deep that the BOX layer is exposed, $H_2O$ produced by chemical reaction

$$SiO_2 + H_2 \rightarrow SiO(\uparrow) + H_2O \qquad (1)$$

between $SiO_2$ and $H_2$ in a hot hydrogen atmosphere reacts with silicon as is given by

$$Si + H_2O \rightarrow SiO(\uparrow) + H_2 \qquad (2)$$

As a result, the defects become more conspicuous.

Hence, when $H_2O$ produced by annealing a hydrogen atmosphere is removed from the SOI substrate surface, or production of $H_2O$ is suppressed, the defects can be prevented from becoming conspicuous, and the number of HF defects can be decreased.

The present invention has been made from the above viewpoint, and has as its object to propose a method of annealing an SOI substrate in a reducing atmosphere, which can suppress HF defects from becoming conspicuous upon silicon etching by $H_2O$.

That is, according to the present invention, there is provided an SOI substrate annealing method of annealing an SOI substrate in a reducing atmosphere, characterized in that a thickness of an SOI layer of the SOI substrate is less than 100 nm, and the SOI substrate is annealed in a state wherein a flow of a reducing atmospheric gas parallel to a surface of the SOI substrate is generated near the surface of the SOI substrate by supplying the reducing atmospheric gas from a gas supply port provided near an edge portion of the SOI substrate,.

When the flow velocity of the atmospheric gas near the SOI substrate surface, which is parallel to the SOI substrate surface, is made to be larger than 0, the above-described $H_2O$ produced by the reaction between the $SiO_2$ and $H_2$ can be quickly removed from the substrate surface.

In addition, when the flow velocity of the atmospheric gas is made equal to or larger than the flow velocity of the atmospheric gas in the reactor, the effect of removing $H_2O$ as a reaction product can be increased.

The "average flow velocity of the atmospheric gas in the reactor" means the average flow velocity of a gas flow from an atmospheric gas supply port to an exhaust port, which passes through a sectional area, that is perpendicular to the gas flow, of the reactor excluding the sectional area of the SOI substrate.

One of examples for calculating the average flow velocity of the atmospheric gas in the reactor is explained.

In this example, $H_2$ gas flow rate is assumed 22 slm (standard liter/min; flow volume per 1 min at 1 atm and 0° C.) and pressure in the reactor is assumed 80 Torr (0.1053 atm).

In the reactor of 2–3 cm height and 24–25 cm width, a sectional area of the reactor is estimated as 48–75 cm².

Under the above conditions, $H_2$ gas flow rate during the annealing process is estimated in accordance with Boyle's law; 22/0.1053=209 (l/min).

Flow velocity is estimated; 209*1000/(48 to 75)=2.79 to 4.35 (m/min) (46 to 72.5 (cm/s)).

According to the present invention, there is also provided an SOI substrate annealing method characterized in that the flow of the atmospheric gas is a laminar flow on the substrate surface.

When the flow of the atmospheric gas is a laminar flow on the substrate surface, a uniform and stable HF defect reduction effect can be obtained on the entire surface of the SOI substrate.

In the present invention, a uniform and stable HF defect reduction effect can be obtained on the entire surface of the SOI substrate by rotating the SOI substrate during annealing.

According to the present invention, there is also provided an SOI substrate annealing method characterized in that wherein a temperature of a reactor member is lower than a substrate temperature in annealing.

In a high-temperature annealing furnace generally used in a semiconductor process, silica ($SiO_2$) is used as the reactor member.

When high-temperature annealing is executed in a hydrogen gas atmosphere using the above annealing furnace, chemical reaction given by formula (1) occurs between the member and the atmospheric gas, and silicon etching takes place due to $H_2O$ produced by the reaction.

As in the present invention, when the temperature of the reactor member is lower than the substrate temperature in annealing, chemical reaction between the member and the atmospheric gas can be suppressed. For example, a Halogen lamp or induction heater is employed to suppress the chemical reaction between the reactor member and the atmospheric gas. Alternatively, the reactor may be air-cooled by blowing air to the reactor to suppress the chemical reaction between the member and the atmospheric gas. According to the present invention, there is also provided an SOI substrate annealing method characterized in that a pressure in a reactor in annealing is not more than an atmospheric pressure.

When the pressure in the annealing process is equal to or less than the atmospheric pressure, the mean free path of molecules in the reactor becomes long, and therefore, $H_2O$ can be quickly removed.

The reducing atmospheric gas in the processing step is preferably a gas mixture substantially containing hydrogen or hydrogen and an inert gas.

In an atmosphere containing hydrogen, even at a temperature equal to or lower than the melting point of silicon, at which the surface is not planarized in a nitrogen atmosphere or inert gas atmosphere, a defect filling effect can be obtained because silicon atoms that are sufficiently excited by the thermal energy move.

According to another aspect of the present invention, there is provided an SOI substrate annealing method characterized in that an SOI substrate whose SOI layer has a thickness of less than 100 nm is subjected to annealing, and the SOI substrate is annealed in a state wherein a flow of a reducing atmospheric gas parallel to a surface of the SOI substrate is generated near the surface of the SOI substrate by rotating the SOI substrate.

As described above, with annealing of the present invention, the number of HF defects which abruptly increase in an SOI substrate whose SOI layer has a silicon layer formed by epitaxial growth, contains no COP, and has a thickness smaller than 100 nm or a thickness of 70 nm or less can be reduced, and a high-quality SOI substrate can be manufactured.

According to the present invention, there is also provided an SOI substrate annealing method characterized in that a thickness of an SOI layer of the SOI substrate is less than 100 nm, and the SOI substrate is annealed in a state wherein a flow of a reducing atmospheric gas parallel to a surface of the SOI substrate is generated near the surface of the SOI substrate by rotating the SOI substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

The embodiments of the present invention will be described with reference to the accompanying drawings.

Figure 1:
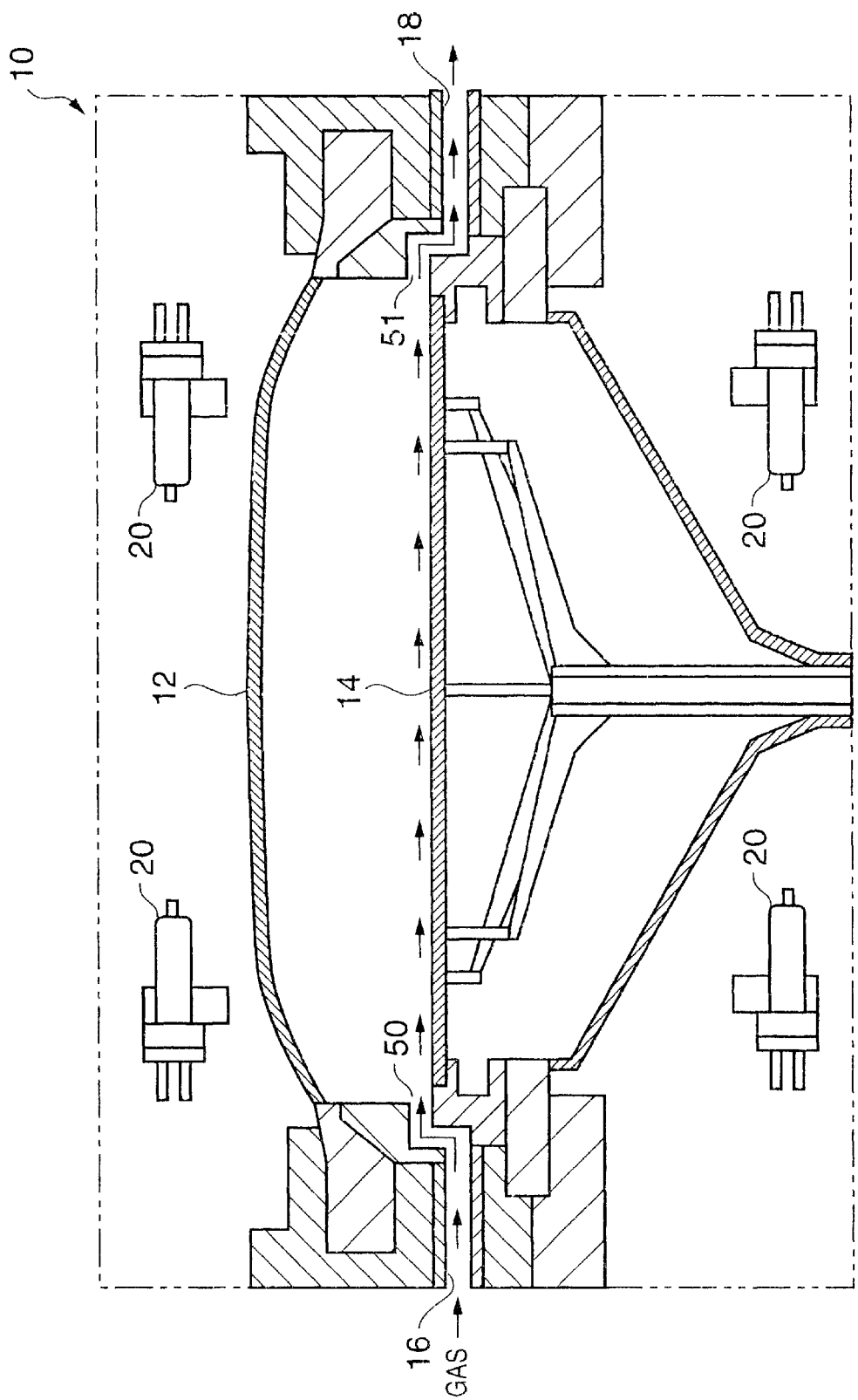
FIG. 1 is a sectional view showing an apparatus used for annealing of the present invention.

FIG. 1 shows an annealing apparatus suitable to practice the present invention.

An annealing apparatus 10 shown in FIG. 1 is a single-wafer-treating apparatus for processing SOI wafers (not shown) one by one. The annealing apparatus 10 has a process chamber 12 formed from silica glass and a susceptor 14 arranged in the process chamber 12 to support a wafer. A supply section 16 for supplying a reducing gas such as hydrogen gas is formed in the side portion of the process chamber 12. An exhaust section 18 is formed at an opposing position. Note that the gas supply section 16 and gas exhaust section 18 have a gas supply port 50 and gas exhaust port 51, respectively.

A plurality of halogen lamps 20 are radially laid out in the upper and lower regions of the process chamber 12. In the annealing apparatus 10 using the halogen lamps 20 with the above arrangement, an SOI substrate is placed on the susceptor 14, and then, the halogen lamps 20 are turned on to heat the SOI substrate. Simultaneously, an atmospheric gas such as hydrogen gas is supplied from the supply port 50 while exhausting the gas from the exhaust port 18. The atmospheric gas flows as a laminar flow along the surface of the SOI substrate heated to a predetermined temperature so that annealing is executed.

At this time, since the susceptor 14 rotates, the SOI substrate can be annealed while being rotated.

After the end of annealing, the SOI substrate is cooled to a predetermined unload temperature and removed from the susceptor 14, thus ending the annealing.

The annealing of the present invention is executed at a temperature equal to or less than the melting point of silicon. Although the lower limit of the annealing temperature is not particularly limited, the annealing is preferably executed at a temperature from 800° C. to 1,200° C. on the basis of the results obtained by evaluating the annealing temperature and progress in surface planarization by movement of surface silicon atoms in SOI substrate annealing in a hydrogen atmosphere, which is proposed in Japanese Patent Laid-Open No. 05-217821.

In the present invention, the annealing time is determined by the state of an object to be processed or the degree of a desired effect and is not particularly defined.

In the above arrangement, since the process chamber 12 formed from silica glass rarely absorbs light emitted from the halogen lamps 20, the temperature is suppressed to about 600° C. or less. Hence, $H_2O$ production by reaction between $H_2$ and the silica of the process chamber 12 can be prevented.

The process chamber 12 may be air-cooled by injecting air to the process chamber 12.

Even if $H_2O$ is produced from the process chamber 12, the $H_2O$ produced from the process chamber 12 does not reach the surface of the SOI wafer because the atmospheric gas supplied from the supply port 16 flows as a laminar flow along the surface of the SOI wafer. That is, the gas flow on the wafer surface prevents HO produced on the chamber surface from sticking to the wafer surface.

The apparatus used for the annealing is not limited to the above-described lamp heating scheme. The same effect as described above can also be obtained by using, e.g., an apparatus of an induction heating scheme. In this case, a silicon substrate is heated by an eddy current flowing through the substrate because it is a semiconductor. However, the silica of the reactor member is not heated because it is an insulator.

The flow velocity of the gas supplied from the gas supply port 50 is preferably 0.01 to 500 cm/s and, more preferably, 0.1 to 100 cm/s.

The distance between the gas supply port 50 and the edge portion of the SOI wafer opposing the gas supply port 50 is 5 cm or less, and preferably, 1 cm or less. The gas supply port 50 and the edge portion are preferably actually in contact with each other.

The gas supply port 50 and the edge portion of the SOI wafer preferably have the following positional relationship. Preferably, the SOI surface is located between the lowest portion of the section of the gas pipe of the gas supply port 50 and the central axis of the gas pipe, or the level of the lowest portion matches the SOI wafer surface level. This is because if a large amount of gas collides with the side surface of the SOI wafer, the laminar gas flow is disturbed. The diameter of the gas supply port 50 is preferably twice or more of the SOI wafer thickness and, more preferably, five times or more of the SOI wafer thickness.

In annealing the SOI wafer while rotating it, the SOI wafer can be continuously or intermittently rotated. To intermittently rotate the SOI wafer, it can be rotated through a predetermined angle every time a predetermined time elapses. For example, after the elapse of a predetermined time, the SOI wafer is rotated clockwise through 90°, and after another elapse of the predetermined time, the SOI wafer is rotated counterclockwise through 180°, thereby continuing annealing for a predetermined time. The SOI wafer may be intermittently rotated in the same direction.

As shown in FIG. 1, the atmospheric gas can be prevented from flowing to the lower surface of the SOI wafer (a surface on the opposite side of the surface where the SOI layer is present), i.e., the lower surface can be prevented from coming into contact with the atmospheric gas.

The SOI layer to be annealed need not always be a single-crystal silicon layer but can be a semiconductor layer formed from Ge, SiGe, SiC, C, GaAs, GaN, AlGaAs, InGaAs, InP, or InAs, or a semiconductor layer containing a plurality of types of layers selected from them. As a semiconductor layer formed from a plurality of types of layers, for example, a semiconductor layer having an Si layer formed on an SiGe layer or an Si layer formed on an SiGe layer can be used. The semiconductor layer may be formed from a plurality of semiconductor layers having the same composition but different impurity concentrations or different resistivity values (e.g., a semiconductor layer having a two-layered structure including a silicon layer having the first resistivity value and a silicon layer formed on that silicon layer and having the second resistivity value different from the first resistivity value).

As a gas species used in annealing of the present invention, hydrogen gas or a gas mixture containing hydrogen gas and an inert gas (e.g., argon gas) can be used. Any other gas species can be used as long as an SOI layer can be planarized.

Some silicon wafers have a portion called a notch as a mark that indicates a plane orientation or the like. When an SOI substrate manufactured using a silicon wafer as a material has a notch, the SOI substrate is preferably set without directing that portion to the gas supply port 50 and annealed.

As another embodiment, annealing can be practiced using an epitaxial growing apparatus reported by Mitani (Shinichi Mitani, Toshiba Technical Report No. 20, p. 28 (1998)).

An annealing method of the present invention using the apparatus of the above report will be described below. The apparatus of the above report is an epitaxial growing apparatus. In the present invention, this apparatus is used as an annealing apparatus in a reducing atmosphere.

Figure 2:
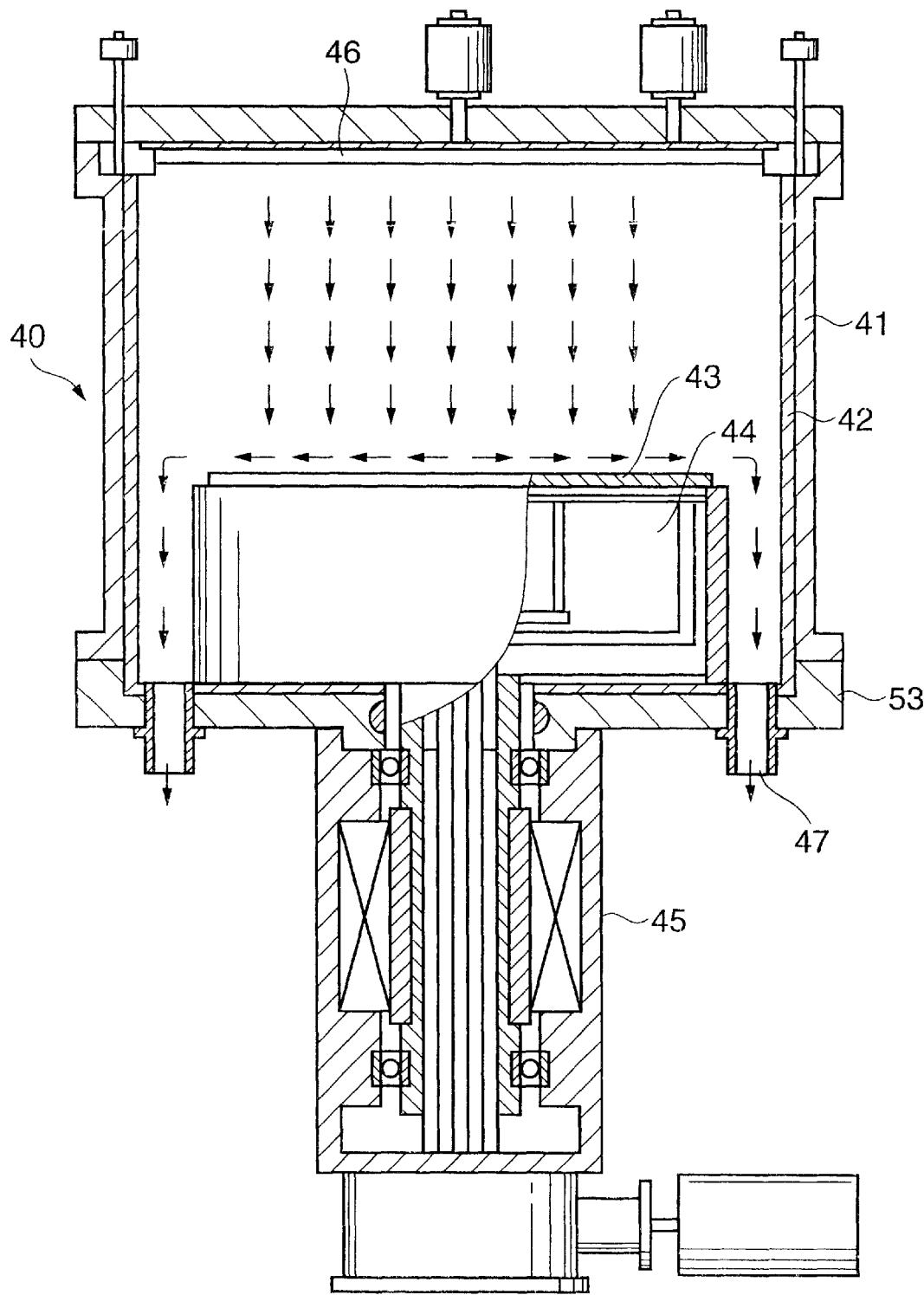
FIG. 2 is a schematic sectional view of an apparatus described in another embodiment of the present invention.

An annealing apparatus 40 shown in FIG. 2 is a single-wafer-treating apparatus for processing SOI wafers (not shown) one by one. A process module for processing a substrate is sealed by a stainless steel chamber 41 having a cylindrical water cooling jacket, and the inner surface of the chamber 41 is covered with a liner 42 made of silica.

A holder 43 for holding a substrate and a heater 44 as a heating source are installed in the chamber.

A rotary drive mechanism 45 for rotating the substrate and holder and the feed port for the heater 44 are arranged under the chamber.

Hydrogen gas is supplied from the upper side of the chamber through a straightening plate 46 and exhausted from an exhaust port 47 on the lower side.

In this apparatus, since a substrate is rotated at a high speed of thousand-odd hundred rpm or more, hydrogen gas supplied from the upper side of the chamber is forcibly attracted to the wafer surface by the pump effect of the substrate and the rotary disk of the holder, which rotate at a high speed.

When an optimum rotational speed is selected in accordance with the flow rate and pressure of the gas to be supplied to the process module, hydrogen gas near the SOI substrate surface flows as a laminar flow along that surface.

In addition, if an optimum rotational speed is selected in accordance with the flow rate and pressure of the gas to be supplied to the process module, the flow velocity of hydrogen gas near the SOI substrate surface can be made higher than the average flow velocity when the gas is supplied from the upper side of the chamber through the straightening plate 46.

The embodiments of the present invention have been described above. The present invention is not limited to the above apparatuses, and any other annealing apparatus capable of realizing the idea of the present invention can be used.

Figure 4:
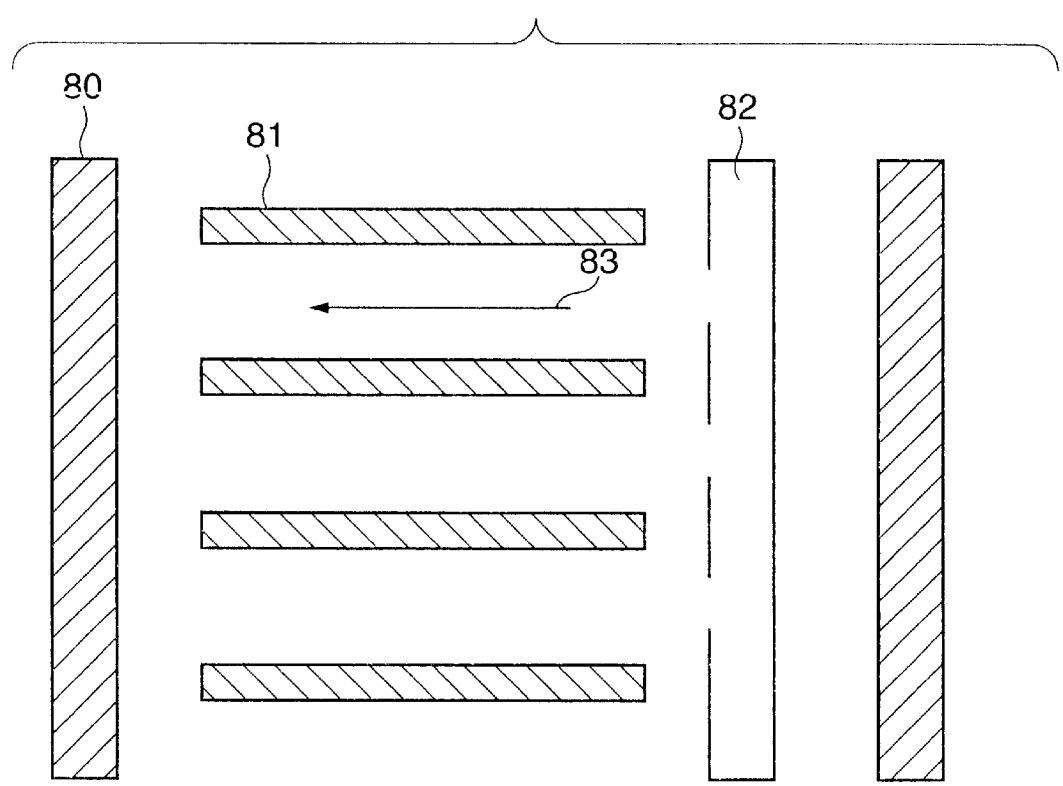
FIG. 4 is a schematic sectional view of an apparatus described in still another embodiment of the present invention.

For example, even a multi-wafer-treating vertical annealing furnace as shown in FIG. 4 can obtain the same effect as that of the present invention.

Referring to FIG. 4, reference numeral 80 denotes a furnace tube; 81, SOI substrates; 82, atmospheric gas supply ports; and 83, an atmospheric gas flow near the SOI substrate surface.

As shown in FIG. 4, when one atmospheric gas supply port 82 is arranged on each SOI substrate 81, the atmospheric gas flow 83 parallel to the SOI substrate surface can be generated near this surface.

Figure 6:
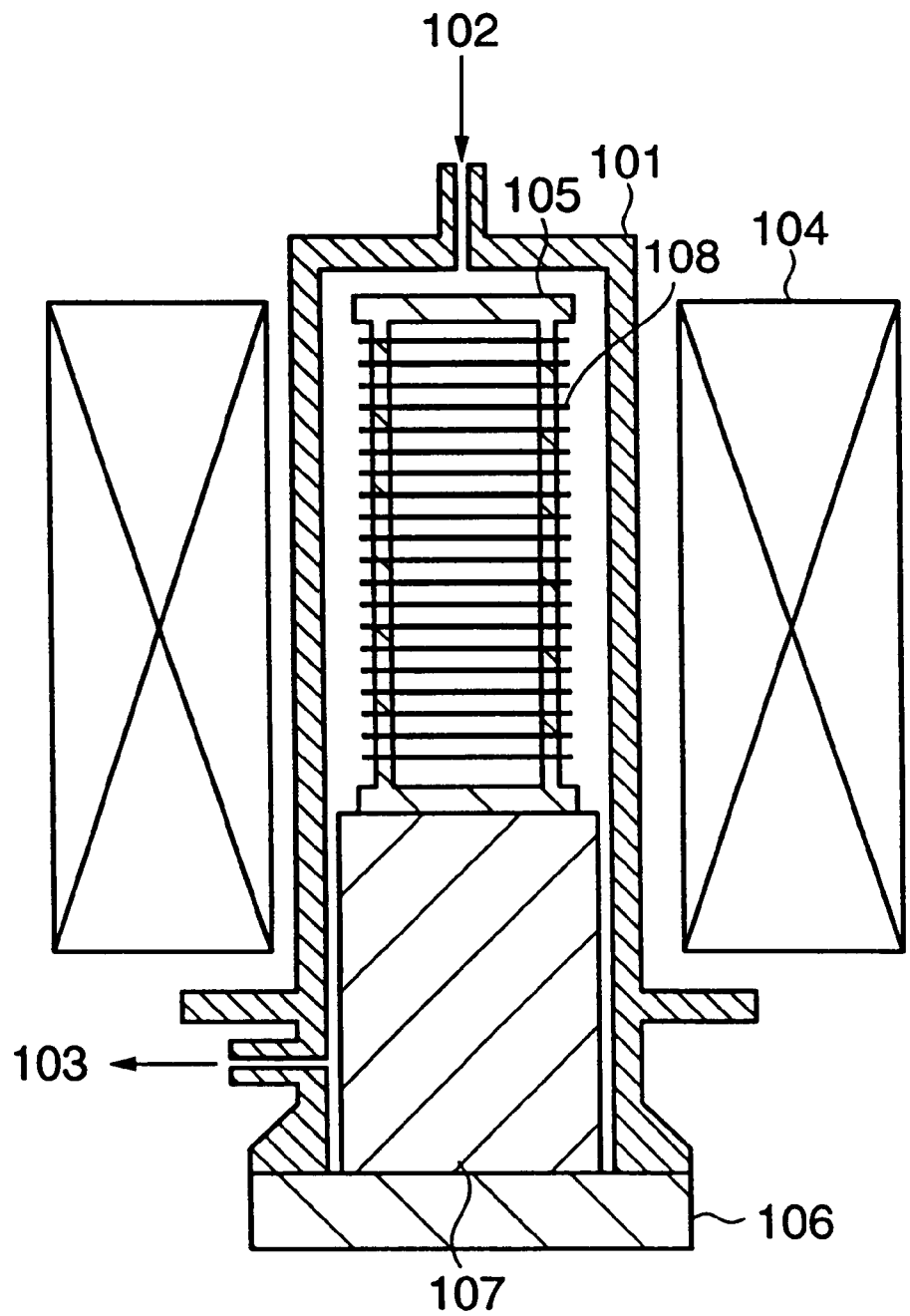
FIG. 6 is a schematic view showing an apparatus used in the prior art and Comparative Examples 3, 4, and 5 of the embodiment.
Figure 7:
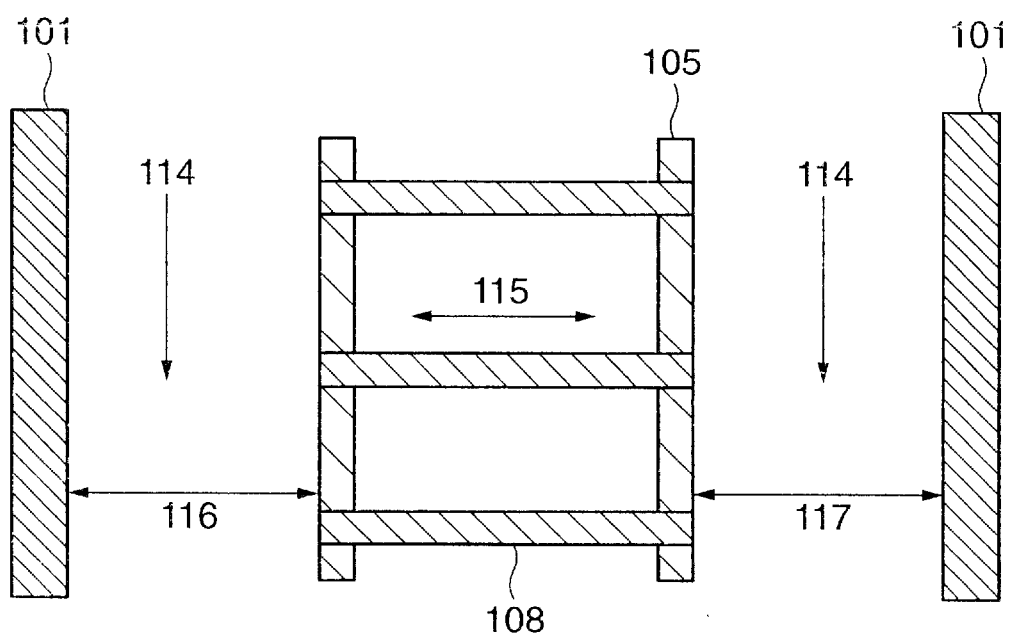
FIG. 7 is a schematic view showing the flows of an atmospheric gas in an annealing furnace shown in FIG. 6.
Figure 8:
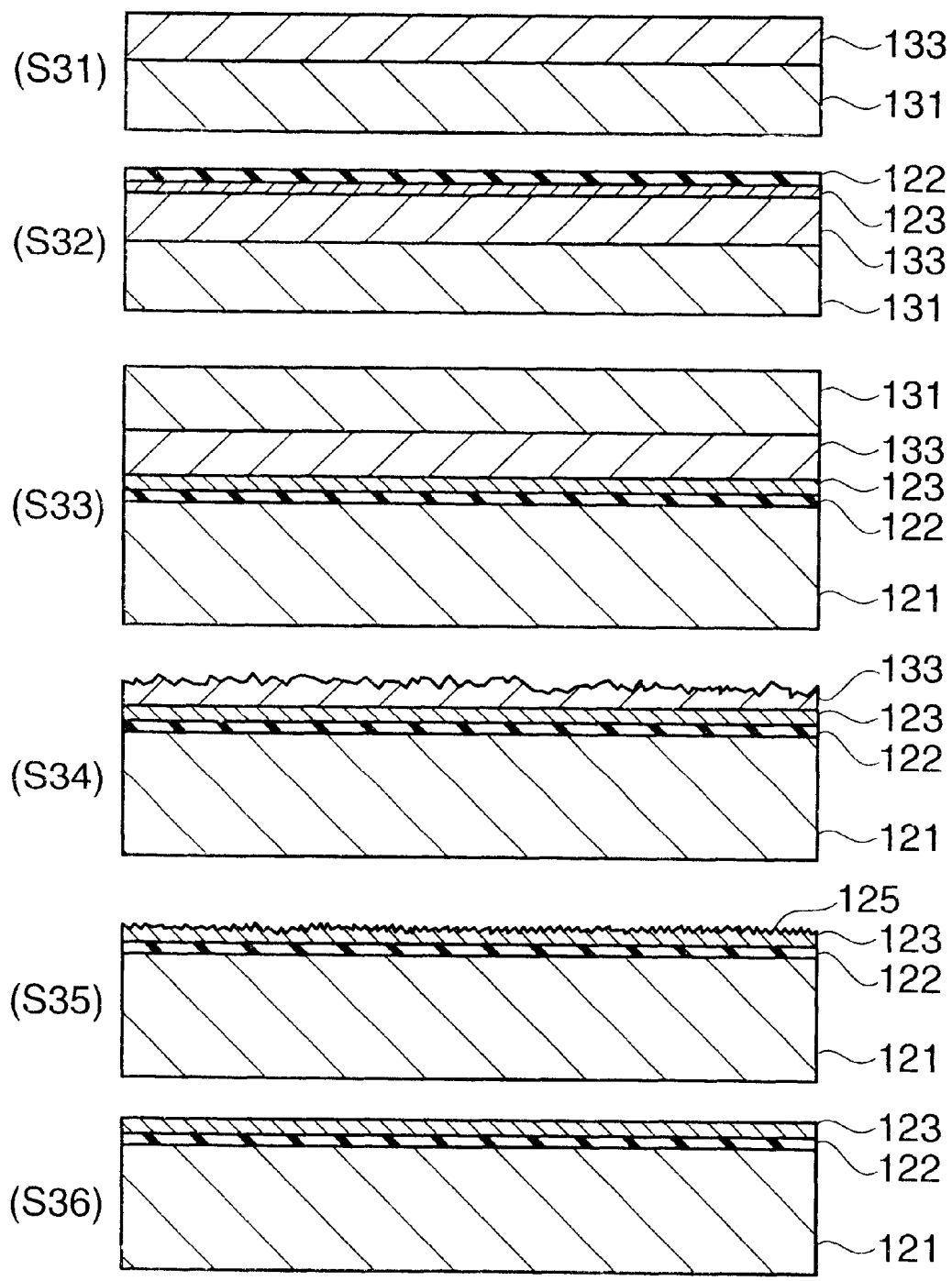
FIG. 8 is a schematic sectional view for explaining an epitaxial layer transfer method.
Figure 9:
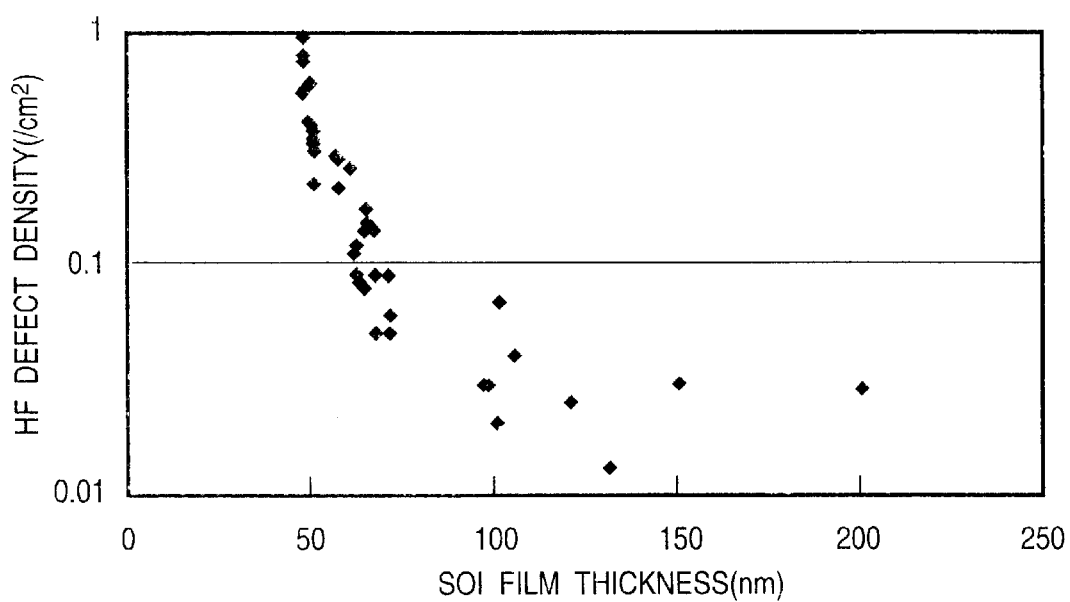
FIG. 9 is a graph showing the relationship between the SOI layer thickness and HF defects in an SOI substrate manufactured by the epitaxial layer transfer method.
Figure 10:
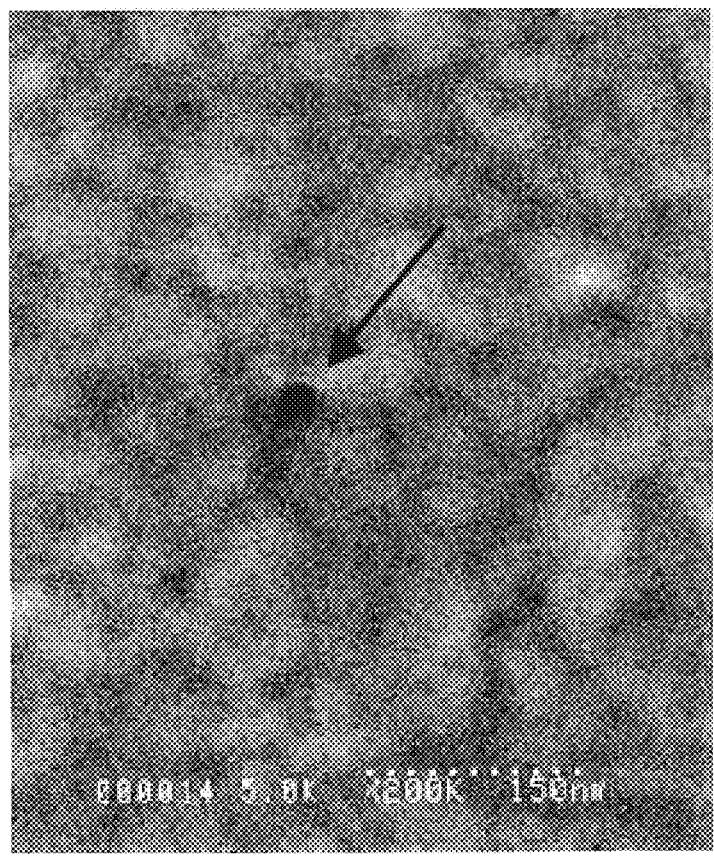
FIG. 10 is a view showing a scanning-electronic-microscopic image of an HF defect center.

Even a multi-wafer-treating vertical annealing furnace as shown in FIG. 6 can obtain the same effect as that of the present invention when a flow velocity 115 of an atmospheric gas near the SOI substrate surface during annealing is prevented from substantially becoming zero by, e.g., making a boat 105 and furnace tube have different intervals 116 and 117 therebetween.

Figure 3:
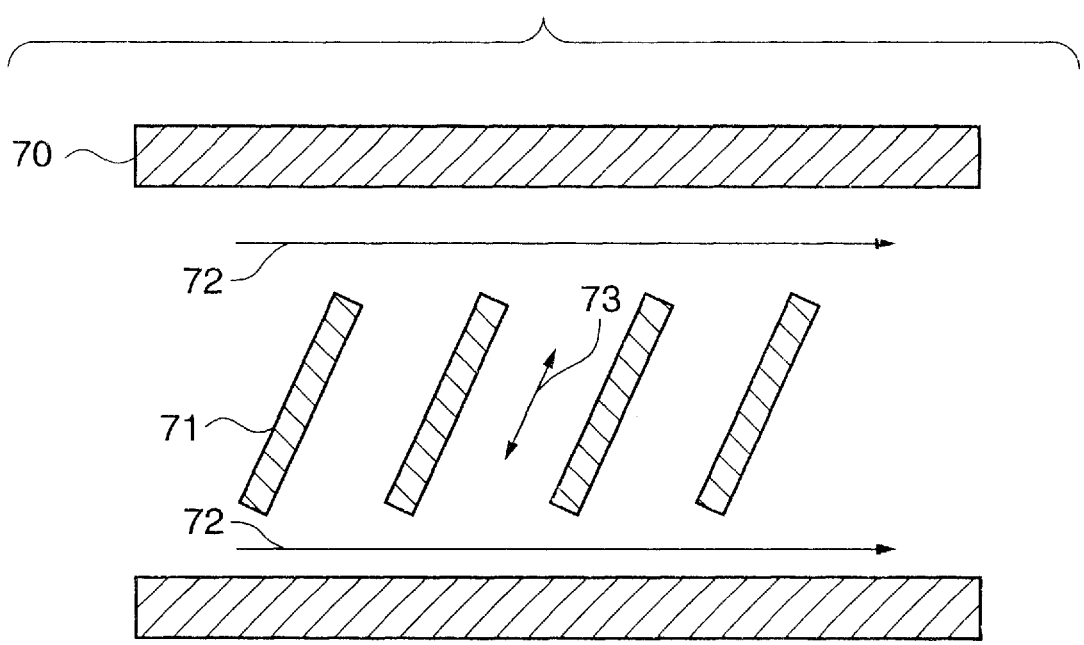
FIG. 3 is a schematic sectional view of an apparatus described in still another embodiment of the present invention.

Even a multi-wafer-treating apparatus having a structure shown in FIG. 3 can also obtain the same effect as that of the present invention. Referring to FIG. 3, reference numeral 70 denotes a furnace tube; 71, SOI substrates; and 72 and 73, atmospheric gas flows.

As shown in FIG. 3, when the SOI substrates 71 are tilted with respect to the atmospheric gas flow 72 in the reactor, and in this state, the atmospheric gas flow 73 parallel to the SOI substrate surfaces are generated, the effect of the present invention can be obtained.

EXAMPLES

Detailed examples of the present invention will be described below.

(SOI Substrate Manufacturing Method)

1) A CZ 6-inch (100) p$^+$-type silicon wafer doped with boron as a p-type impurity and having a resistivity of 0.015 Ω·cm+/−0.01 Ω·cm was prepared.

2) In a solution obtained by mixing 49% HF solution and ethyl alcohol at a ratio of 2:1, the silicon wafer and a 6"-diameter platinum plate were set opposite to each other such that the silicon wafer served as an anode and the platinum plate served as a cathode. The lower surface side of the silicon wafer was made to oppose the upper surface side of another p$^+$-type silicon wafer via the same solution. The end wafer opposed a 6"-diameter platinum plate. The solution was partitioned by the wafers to prevent electrical connection between the solution parts between the wafers. A current with a current density of 10 mA/cm$^2$ was supplied for 12 min to flow between the silicon wafers and the platinum plates so as to anodize the silicon wafers, thereby forming a plurality of 12-μm thick porous silicon layers on the surfaces.

3) The wafers having the porous silicon layers were oxidized in an oxygen atmosphere at 400° C. With this oxidation processing, an only 50-Å thick oxide film is formed. Hence, the oxide silicon film is formed only on the surface of porous silicon and on the inner surfaces of pores. A single-crystal silicon region remains inside.

4) The wafers were exposed to HF solution diluted to 1.25% for about 30 sec and dipped in pure water for 10 min to remove the very thin silicon oxide films on the surfaces of the porous layers by overflow rinse.

5) The wafers were set in a wafer carrier and placed in the load-lock chamber of an epitaxial CVD growing apparatus in which the load-lock chamber where wafers in the wafer carrier were set, a transfer chamber having a wafer transfer robot, and a process chamber as shown in FIG. 1 are connected. The pressure in the load-lock chamber was reduced from the atmospheric pressure to 133 Pa (1 Torr) or less by a dry pump. After that, N$_2$ was supplied to set the pressure to 1.067×10$^4$ Pa (80 Torr). The transfer chamber was held at 1.067×10$^4$ Pa (80 Torr) in advance by supplying N$_2$. A susceptor made of carbon with a CVD-SiC coating is installed in the process chamber to hold a wafer. The susceptor was heated to 750° C. by an IR lamp in advance. Hydrogen gas generated by a hydrogen generator using a hot palladium alloy was being supplied into the process chamber through a 10-m long stainless steel pipe with a polished inner surface.

The wafer was transferred from the load-lock chamber to the process chamber through the transfer chamber by the transfer robot and placed on the susceptor.

6) The wafer transferred onto the susceptor was heated by an IR lamp at a rate of 100° C./min and held at 950° C. for 2 sec by pre-baking processing.

SiH$_4$ was added to the carrier gas of hydrogen at a concentration of 28 ppm, processing is executed for 200 sec, and addition of SiH$_4$ was stopped. After that, the temperature was reduced to 900° C. SiH$_2$Cl$_2$ was added at a concentration of 0.5 mol %. After a non-porous single-crystal silicon film was formed, the temperature was reduced to 750° C. The wafer was unloaded to the load-lock chamber through the transfer chamber by the transfer robot.

7) The wafer having the epitaxially grown non-porous single-crystal silicon was set in a vertical furnace. The surface of the non-porous single-crystal silicon was oxidized in a gas mixture containing water vapor and residual oxygen, which was formed by combusting oxygen and hydrogen, by annealing at 1,000° C. to form a silicon oxide film having a thickness of 60 nm.

8) The above wafer and the second silicon wafer were cleaned in the cleaning line of the silicon semiconductor process. The two wafers were gently stacked with their first major surfaces facing each other, and the center of the stack was pressed to integrate the two wafers.

9) The integrated wafer set was set in the vertical and annealed in an oxygen atmosphere at 1,100° C. for 1 hr.

10) The lower surface side of the wafer having porous silicon formed was ground by a grinder to expose the porous silicon across the wafer surface.

11) When the exposed porous silicon layer was dipped in a solution mixture containing HF and hydrogen peroxide, the porous silicon was completely removed in about 2 hr, and an interference color by the non-porous single-crystal silicon layer and the thermal silicon oxide film was observed across the wafer surface.

Comparative Example 1

Annealing in a Reducing Gas Atmosphere was not Executed; Average SOI Layer Thickness=80.3 nm Three SOI substrates for which the average thickness of SOI layers formed by the above-described epitaxial layer transfer method was 80.3 nm were not annealed in a reducing gas atmosphere but were dipped in a 49% hydrofluoric acid for 15 min.

HF defects in these SOI substrates were observed using an optical microscope. In Comparative Example 1, a range with a radius of 55 mm from the substrate center was observed.

The numbers of observed HF defects were divided by the observation area to obtain HF defect densities.

The HF defect densities were 0.074, 0.105, and 0.295 defects/cm$^2$, respectively, and the average density was 0.158 defects/cm$^2$.

Comparative Example 2

Annealing in a Reducing Gas Atmosphere was not Executed; Average SOI Layer Thickness=120.6 nm Three SOI substrates for which the average thickness of SOI layers formed by the above-described epitaxial layer transfer method was 120.6 nm were not annealed in a reducing gas atmosphere but were dipped in a 49% hydrofluoric acid for 15 min.

HF defects in these SOI substrates were observed using an optical microscope. In Comparative Example 2, a range with a radius of 55 mm from the substrate center was observed.

The numbers of observed HF defects were divided by the observation area to obtain HF defect densities. The HF defect densities were 0.031, 0.042, and 0.042 defects/cm$^2$, respectively, and the average density was 0.039 defects/cm$^2$.

Comparative Example 3

Hydrogen Annealing Using Vertical Furnace, 1, 050° C. for 180 min; Average SOI Layer Thickness=73.6 nm Two SOI substrates for which the average thickness of SOI layers formed by the above-described epitaxial layer transfer method in the same batch as that of Comparative Example 1 was 78.5 nm were cleaned by a cleaning line generally used in a silicon semiconductor device process and set in a vertical annealing furnace shown in FIG. 6, and annealing disclosed in Japanese Patent Laid-Open No. 05-217821 was executed.

The average thickness value of the SOI layers in the SOI substrates before annealing was 73.6 nm due to etching by cleaning.

Annealing was executed in accordance with the following procedure. A furnace lid 106 was moved downward in advance. In this state, SOI substrates 108 were set in a boat 105. The furnace lid 106 was moved to the position shown in FIG. 6 to place the SOI substrates 108 in the process chamber and close the opening portion of the furnace tube. The furnace lid 106 was operated by an elevating mechanism (not shown).

The interior of the process chamber is normally preheated to about 600° C. To prevent oxidation of the SOI substrate surfaces, a nitrogen atmosphere is formed in the process chamber.

The interior of the process chamber was replaced with a hydrogen gas atmosphere at the atmospheric pressure by supplying 100% hydrogen gas from a supply pipe 102. The hydrogen gas had been purified by a commercially available hydrogen generator which used a palladium alloy and was connected to the apparatus through a 7-m long stainless steel pipe with a polished inner surface.

The interior of the process chamber was heated to 1,050° C. by a heater 104, and annealing was executed for 3 hrs.

The heating rate in heating from 600° C. to 1,050° C. was 0.17° C./sec.

After the elapse of 3 hrs, the temperature of the heater 104 was reduced, and then, the atmosphere was replaced by supplying nitrogen gas into the process chamber. The furnace lid 106 was moved downward, and the SOI substrates 108 were unloaded.

These SOI substrates were dipped in 49% hydrofluoric acid for 15 min, and HF defects within the range with a radius of 55 nm from the substrate center were observed using an optical microscope.

The numbers of observed HF defects were divided by the observation area to obtain HF defect densities. The HF defect densities were 0.042 and 0.011 defects/cm$^2$, respectively, and the average value was 0.026 defects/cm$^2$.

The average value of the HF defect densities was compared with the average value of the HF defect densities of Comparative Example 1. The HF defect density of the SOI substrates that underwent the above annealing was 16.4% the HF defect density of Comparative Example 1.

Comparative Example 4

Hydrogen Annealing Using Vertical Furnace, 1,050° C. for 180 min; Average SOI Layer Thickness=114.9 nm Three SOI substrates for which the average thickness of SOI layers formed by the above-described epitaxial layer transfer method in the same batch as that of Comparative Example 2 was 120.6 nm were cleaned by a cleaning line generally used in a silicon semiconductor device process and annealed by the same method as that of Comparative Example 3.

The average thickness value of the SOI layers in the SOI substrates before annealing was 114.9 nm due to etching by cleaning.

These SOI substrates were dipped in 49% hydrofluoric acid for 15 min, and HF defects within the range with a radius of 55 nm from the substrate center were observed using an optical microscope.

The numbers of observed HF defects were divided by the observation area to obtain HF defect densities.

The HF defect densities were 0, 0.021, and 0 defects/cm$^2$, respectively, and the average value was 0.007 defects/cm$^2$.

The average value of the HF defect densities was compared with the average value of the HF defect densities of Comparative Example 2. The HF defect density of the SOI substrates that underwent the above annealing was 18.4% the HF defect density of Comparative Example 2.

Comparative Example 5

Hydrogen Annealing Using Vertical Furnace, 1,050° C. for 3 min; Average SOI Layer Thickness=74.9 nm Two SOI substrates for which the average thickness of SOI layers formed by the above-described epitaxial layer transfer method in the same batch as that of Comparative Example 1 was 81.2 nm were cleaned by a cleaning line generally used in a silicon semiconductor device process and set in a vertical hydrogen annealing furnace shown in FIG. 6, and annealing disclosed in Japanese Patent Laid-Open No. 05-217821 was executed.

The average thickness value of the SOI layers in the SOI substrates before annealing was 74.9 nm due to etching by cleaning.

Annealing was executed in accordance with the following procedure. A furnace lid 106 was moved downward in advance. In this state, SOI wafers 108 were set in a boat 105. The furnace lid 106 was moved to the position shown in FIG. 6 to place the SOI wafers 108 in the process chamber and close the opening portion of the furnace tube. The furnace lid 106 was operated by an elevating mechanism (not shown).

The interior of the process chamber is normally preheated to about 600° C.

To prevent oxidation of the SOI substrate surfaces, a nitrogen atmosphere is formed in the process chamber.

The interior of the process chamber was replaced with a hydrogen gas atmosphere at the atmospheric pressure by supplying 100% hydrogen gas from a supply pipe 102. The hydrogen gas had been purified by a commercially available hydrogen generator which used a palladium alloy and was connected to the apparatus through a 7-m long stainless steel pipe with a polished inner surface.

The interior of the process chamber was heated to 1,050° C. by a heater 104, and annealing was executed for 3 min.

The heating rate in heating from 600° C. to 1,050° C. was 0.17° C./sec.

After the elapse of 3 min, the temperature of the heater 104 was reduced, and then, the atmosphere was replaced by supplying nitrogen gas into the process chamber. The furnace lid 106 was moved downward, and the SOI wafers 108 were unloaded.

These SOI substrates were dipped in 49% hydrofluoric acid for 15 min, and HF defects within the range with a radius of 55 nm from the substrate center were observed using an optical microscope.

The numbers of observed HF defects were divided by the observation area to obtain HF defect densities. The HF defect densities were 0.032 and 0.084 defects/cm², respectively, and the average value was 0.058 defects/cm².

Example 1

Processing by Single-Wafer-Treating Epitaxial Growing Apparatus; Average SOI Layer Thickness= 74.9 nm Fifteen SOI substrates for which the average thickness of SOI layers formed by the above-described epitaxial layer transfer method in the same batch as that of Comparative Example 1 was 79.1 nm were cleaned by a cleaning line generally used in a silicon semiconductor device process and annealed by a single-wafer-treating epitaxial growing apparatus.

The average thickness value of the SOI layers in the SOI substrates before annealing was 74.9 nm due to etching by cleaning.

The single-wafer-treating epitaxial growing apparatus used in Example 1 comprises a load-lock chamber (FIG. 1) of an epitaxial CVD growing apparatus to which a load-lock chamber where wafers in a wafer carrier were set, a transfer chamber (not shown) with a wafer transfer robot set, and a process chamber are connected.

Annealing was executed in accordance with the following procedure. First, the SOI substrates were set in a wafer carrier and placed in the load-lock chamber.

The pressure in the load-lock chamber was reduced from the atmospheric pressure to 133 Pa (1 Torr) or less by a dry pump. After that, $N_2$ gas was supplied to set the pressure to $1.067 \times 10^4$ Pa (80 Torr). The transfer chamber was held at $1.067 \times 10^4$ Pa (80 Torr) in advance by supplying $N_2$. A susceptor 14 made of carbon with a SiC coating was installed in the process chamber to hold a wafer. The susceptor 14 was heated to 750° C. by a halogen lamp in advance. Hydrogen gas generated by a hydrogen generator using a hot palladium alloy was being supplied into the process chamber through a 10-m long stainless steel pipe with a polished inner surface.

The SOI substrate was transferred from the load-lock chamber to the process chamber through the transfer chamber by the transfer robot and placed on the susceptor.

The pressure in the process chamber was set to $8 \times 10^4$ Pa (600 Torr). Then, the SOI substrate placed on the susceptor was heated to 1,050° C. by the halogen lamp and annealed for 3 min.

The average flow velocity in the reactor was about 46.7 cm/sec.

The heating rate in heating from 750° C. to 1,050° C. (annealing temperature) was tested for 5 standards each using three substrates (Table 1).

TABLE 1

| Heating rate (° C./sec) | 0.1 | 1 | 5 | 7 | 10 |
|---|---|---|---|---|---|
| Number of processed substrates | 3 | 3 | 3 | 3 | 3 |

After annealing, the temperature was reduced to 750° C. The SOI substrate was unloaded to the load-lock chamber through the transfer chamber by the transfer robot.

These SOI substrates were dipped in 49% hydrofluoric acid for 15 min, and HF defects within the range with a radius of 55 nm from the substrate center were observed using an optical microscope.

The numbers of observed HF defects were divided by the observation area to obtain HF defect densities. The average value of the HF defect densities of the 15 annealed substrates was 0.008 defects/cm².

The average value of the HF defect densities was compared with the average value of the HF defect densities of Comparative Example 1. The HF defect density of the SOI substrates that underwent the above annealing was 5.1% the HF defect density of Comparative Example 1.

It was confirmed that the number of HF defects decreased by annealing of Example 1.

The average value of the HF defect densities was compared with the average value of the HF defect densities of Comparative Example 3. The HF defect density of the SOI substrates that underwent the above annealing was 30.8% the HF defect density of Comparative Example 3.

As is apparent from this result, the HF defect reduction effect by annealing of the present invention is higher than annealing in a reducing atmosphere using a vertical annealing furnace disclosed in Japanese Patent Laid-Open No. 05-217821.

Table 2 shows the relationship between the HF defect density and the heating rate from 750° C. to 1,050° C. (annealing temperature).

TABLE 2

| Heating rate (° C./sec) | 0.1 | 1 | 5 | 7 | 10 |
|---|---|---|---|---|---|
| Average thickness of SOI layer (nm) | 74.5 | 74.7 | 75.9 | 74.6 | 74.7 |
| HF defect density average value (defects/cm²) | 0.004 | 0.011 | 0.011 | 0.007 | 0.011 |

As shown in Table 2, no correlation was observed between the HF defect density and the heating rate to the annealing temperature.

To obtain a finding about the correlation between the annealing time and the HF defect density, the result of HF defect densities of Example 1 was compared with the average value of the HF defect densities of Comparative Example 5.

In Comparative Example 5, annealing in a reducing atmosphere using a vertical annealing furnace was executed, and the annealing time was set to 3 min as in Example 1.

The heating rate to the annealing temperature was 0.17° C./sec.

The average value of HF defect densities of Comparative Example 5 is 0.058 defects/cm². This is larger than the HF defect density average value of Example 1 at the closest heating rate of 0.1° C./sec by 14.5 times.

Hence, the annealing time and the HF defect density reduction effect have no correlation.

As is apparent from the above result, the HF defect reduction effect of Example 1 derives from the flow velocity of the atmospheric gas near the SOI substrate surface parallel to the SOI substrate surface in annealing.

Comparative Example 6

Processing by Single-Wafer-Treating Epitaxial Growing Apparatus; Average SOI Layer Thickness= 114.3 nm Fifteen SOI substrates for which the average thickness of SOI layers formed by the above-described epitaxial layer transfer method in the same batch as that of Comparative Example 2 was 119.1 nm were cleaned by a cleaning line generally used in a silicon semiconductor device process and annealed by the same method as that of Example 1.

The average thickness value of the SOI layers in the SOI substrates before annealing was 114.3 nm due to etching by cleaning.

The heating rate in heating from 750° C. to 1,050° C. (annealing temperature) was tested for 5 standards each using three substrates (Table 1).

After annealing, these SOI substrates were dipped in 49% hydrofluoric acid for 15 min, and HF defects within the range with a radius of 55 nm from the substrate center were observed using an optical microscope.

The numbers of observed HF defects were divided by the observation area to obtain HF defect densities. The average value of the HF defect densities of the 15 annealed substrates was 0.009 defects/cm$^2$.

The average value of the HF defect densities was compared with the average value of the HF defect densities of Comparative Example 2. The HF defect density of the SOI substrates that underwent the above annealing was 23.7% the HF defect density of Comparative Example 2.

It was confirmed that HF defects was decreased by annealing with the reducing atmosphere.

The average value (0.009 defects/cm$^2$) of the HF defect densities was compared with the average value of the HF defect densities of Comparative Example 4. The HF defect density of the SOI substrates that underwent the above annealing was 1.29 times that of Comparative Example 4. That is, there were not remarkable differences between Comparative Example 6 and Comparative Example 4. The differences between Comparative Example 3 and Example 1, and the differences between Comparative Example 4 and Comparative Example 6 indicate that when the thickness of SOI layer is thin enough, e.g., the thickness is 100 nm or less, the effect of the present invention becomes large.

Table 3 shows the relationship between the HF defect density and the heating rate from 750° C. to 1,050° C. (annealing temperature) in Comparative Example 6.

TABLE 3

| Heating rate (° C./sec) | 0.1 | 1 | 5 | 7 | 10 |
|---|---|---|---|---|---|
| Average thickness of SOI layer (nm) | 114.8 | 114.4 | 112.3 | 114.6 | 115.1 |
| HF defect density average value (defects/cm$^2$) | 0.028 | 0.003 | 0 | 0.007 | 0.007 |

As shown in Table 3, no correlation was observed between the HF defect density and the heating rate to the annealing temperature.

Figure 5:
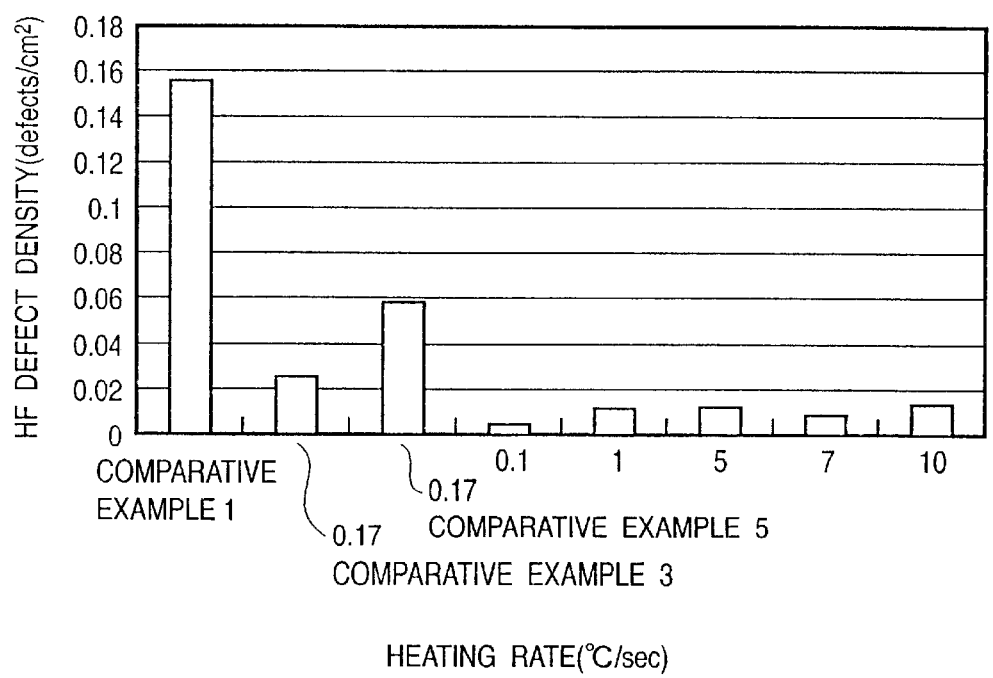
FIG. 5 is a graph showing HF defect densities before annealing of the present invention (Comparative Example 1), after annealing of a prior art in a reducing atmosphere (Comparative Examples 3 and 5), and after annealing of the present invention (Example 1)

FIG. 5 is a graph showing HF defect density average values before annealing of the present invention (Comparative Example 1), after the conventional annealing in a reducing atmosphere (Comparative Examples 3 and 5), and after annealing of the present invention (Example 1). According to the present invention, defects (HF defects) in the SOI layer of an SOI substrate and, more particularly, HF defects that increase as the SOI layer becomes thin can be reduced by annealing the SOI substrate in a reducing gas atmosphere.

As has been described above, according to the present invention, defects (HF defects) in the SOI layer of an SOI substrate and, more particularly, HF defects that increase as the SOI layer becomes thin can be reduced by annealing the SOI substrate in a reducing gas atmosphere.

Hence, a high-quality thin film SOI substrate with minimum HF defects can be provided.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor-on-insulator (SOI) substrate annealing method comprising annealing an SOI substrate having an SOI layer with a thickness of less than 100 nm in a reducing atmosphere such that a flow of a reducing atmospheric gas parallel to a surface of the SOI substrate is generated near the surface of the SOI substrate by supplying the reducing atmospheric gas from a gas supply port provided near an edge portion of the SOI substrate, wherein a flow velocity of the reducing atmospheric gas near the surface of the SOI substrate is not less than an average flow velocity of the reducing atmospheric gas in a reactor.

2. The method according to claim 1, wherein the SOI layer of the SOI substrate does not contain crystal originated particles (COP).

3. The method according to claim 1, wherein the SOI substrate has a semiconductor layer formed by epitaxial growth.

4. The method according to claim 1, wherein the flow of the reducing atmospheric gas is a laminar flow on the surface of the SOI substrate.

5. The method according to claim 1, wherein the SOI substrate is rotated during annealing.

6. The method according to claim 1, wherein a temperature of a reactor member is lower than a substrate temperature in annealing.

7. The method according to claim 1, wherein a pressure in a reactor in annealing is not more than an atmospheric pressure.

8. The method according to claim 1, wherein the reducing atmospheric gas is a gas mixture containing hydrogen or hydrogen and an inert gas.

9. The method according to claim 1, wherein a pore with a diameter of not more than 60 nm is closed by annealing the SOI substrate.

10. An SOI substrate wherein the SOI substrate is annealed by the annealing method of claim 1.

11. A semiconductor-on-insulator (SOI) substrate annealing method comprising annealing an SOI substrate having an SOI layer with a thickness of less than 100 nm in a reducing atmosphere such that a flow of a reducing atmospheric gas parallel to a surface of the SOI substrate is generated near the surface of the SOI substrate by rotating the SOI substrate.

12. The method according to claim 1, wherein the gas supply port substantially contacts with an edge portion of the SOI substrate.

* * * * *

UNITED STATES PATENT AND TRADEMARK OFFICE
CERTIFICATE OF CORRECTION

PATENT NO. : 6,660,606 B2
DATED : September 27, 2001
INVENTOR(S) : Hiroshi Miyabayashi et al.

It is certified that error appears in the above-identified patent and that said Letters Patent is hereby corrected as shown below:

Title page,
Item [56], References Cited, OTHER PUBLICATIONS, insert -- The International Technology Roadmap for Semiconductors, p. 110 .(1999) --.

Column 2,
Line 41, "p. 111." should read -- p. 111). --.

Column 9,
Line 1, "HO" should read -- $H_2O$ --.

Signed and Sealed this

Thirteenth Day of July, 2004

JON W. DUDAS
*Acting Director of the United States Patent and Trademark Office*